United States Patent
Suzuki et al.

[11] Patent Number: 6,140,016
[45] Date of Patent: Oct. 31, 2000

[54] PHOTOSENSITIVE COLORED COMPOSITION FOR COLOR FILTER

[75] Inventors: Nobuo Suzuki; Koji Inoue; Naoki Kato, all of Shizuoka, Japan

[73] Assignees: Fuji Photo Film Co. Ltd., Kanagawa; Fujifilm Olin Co., Ltd., Shizouka, both of Japan

[21] Appl. No.: 09/247,072

[22] Filed: Feb. 9, 1999

[30] Foreign Application Priority Data

Feb. 19, 1998 [JP] Japan ................................. 10-037559

[51] Int. Cl.$^7$ ................................. G03F 7/032; G03C 1/73
[52] U.S. Cl. ................................. 430/281.1; 430/270.1; 430/905; 524/597
[58] Field of Search ................................. 430/270.1, 286.1, 430/281.1, 905, 913; 524/92, 597, 720; 106/253

[56] References Cited

U.S. PATENT DOCUMENTS

| | | | |
|---|---|---|---|
| 4,415,685 | 11/1983 | Iqbal et al. ................................. | 524/92 |
| 4,585,878 | 4/1986 | Jost et al. ................................. | 548/453 |
| 5,145,524 | 9/1992 | Ganci ................................. | 106/493 |
| 5,368,976 | 11/1994 | Tajima et al. ................................. | 430/176 |
| 5,380,870 | 1/1995 | Hari et al. ................................. | 548/453 |
| 5,969,154 | 10/1999 | Hao et al. ................................. | 548/453 |

FOREIGN PATENT DOCUMENTS

WO 98/25927  6/1998  WIPO .

OTHER PUBLICATIONS

Japanese Patent No. 10090889A (abstract) "Photopolymeric photosensitive composition . . . ", Apr. 10, 1998.

*Primary Examiner*—Janet Baxter
*Assistant Examiner*—Yvette M. Clarke
*Attorney, Agent, or Firm*—Sughrue, Mion, Zinn, Macpeak & Seas, PLLC

[57] ABSTRACT

A photosensitive colored composition for a color filter is described, which comprises (A) a pigment, (B) a binding resin, (C) a radiation-sensitive compound, and (D) a solvent, wherein (A) a pigment contains a pigment having an average particle size of from 0.01 to 0.2 μm represented by formula (I):

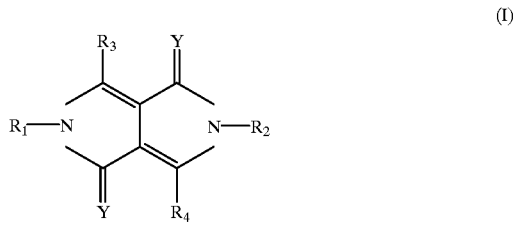

wherein Y represents an oxygen atom or a sulfur atom; $R_1$ and $R_2$, which may be the same or different, each represents a hydrogen atom, an alkyl group, a cycloalkyl group, an alkenyl group, an alkynyl group, an aryl group, an aralkyl group, a carbamoyl group, an alkylcarbamoyl group, an arylcarbamoyl group, or an alkoxycarbonyl group; and $R_3$ and $R_4$, which may be the same or different, each represents an alkyl group, a cycloalkyl group, an aralkyl group, or a carbocyclic or heterocyclic aromatic residue.

9 Claims, 1 Drawing Sheet

PHOTOSENSITIVE COLORED COMPOSITION FOR COLOR FILTER

FIELD OF THE INVENTION

The present invention relates to a photosensitive colored composition for a color filter containing a pigment and more specifically relates to a photosensitive colored composition for a color filter suitable for producing a color filter which is used for a liquid crystal display element and a solid-state camera element.

BACKGROUND OF THE INVENTION

As methods for producing a color filter which is used for a liquid crystal display element and a solid-state camera element, a dyeing method, a printing method, an electrodeposition method and a pigment dispersing method are well-known.

A dyeing method is a method of producing a color filter by dyeing a base material to be dyed comprising a natural resin such as gelatin, glue, casein, etc., or a synthetic resin such as amine-modified polyvinyl alcohol, etc. with a dye such as an acid dye.

As dyes are used in a dyeing method, there are various problems such as light fastness, heat resistance, moisture resistance, etc. In addition, it is difficult to control dyeing and fixing properties uniform in a big image plane and uneven coloring is liable to occur. Further, a dyeing protecting layer is necessary in dyeing, therefore, processes are complicated.

An electrodeposition method is a method of producing a color filter by previously forming a transparent electrode of a prescribed pattern, ionizing a resin containing a pigment dissolved or dispersed in a solvent, and applying voltage to form a colored image in a pattern.

In an electrodeposition method, a photolitho process comprising a stage of forming a film of a transparent electrode for color filter formation and a stage of etching is necessary in addition to the formation of a transparent electrode for display. If short circuit is caused at that time, it results in a line defect leading to yield reduction. An electrodeposition method is theoretically difficult to be applied to arrangement other than stripe, e.g., a mosaic arrangement. Further, there is such a problem as the control of a transparent electrode is difficult.

A printing method is a simply easy method of producing a color filter by printing such as offset printing using inks comprising pigments dispersed in a thermosetting resin or an ultraviolet-curing resin, but as inks which can be used in printing are highly viscous, filtering is difficult, defects are liable to occur due to dusts, impurities and gelled products of ink binders, and there are problems in accuracies of positioning and line breadth according to printing accuracy and surface smoothness.

A pigment dispersing method is a method of producing a color filter by a photolitho process using radiation-sensitive colored compositions comprising pigments dispersed in various photosensitive compositions. This method uses pigments, therefore, the method is stable against light and heat and as patterning is carried out by a photolitho process, positioning accuracy is sufficient and suitable for producing a color filter for a big image plane and a high definition color display.

When a color filter is produced by a pigment dispersing method, a film is formed by coating radiation-sensitive compositions on a glass base material by a spin coater or a roll coater and drying. The coated film is patternwise exposed and developed to obtain a colored pixel. This procedure is repeated every color and then a color filter is obtained.

A pigment dispersing method is disclosed in JP-A-1-102469 (the term "JP-A" as used herein means an "unexamined published Japanese patent application"), JP-A-1-152499, JP-A-2-181704, JP-A-2-199403, JP-A-4-76062, JP-A-5-273411, JP-A-6-184482 and JP-A-7-140654, and negative type photosensitive compositions in which a photopolymerizable monomer and a photopolymerization initiator are used as an alkali-soluble resin are disclosed in the above references published.

However, in recent years, higher definition of liquid crystal display elements, further electric power saving of back light, and higher luminance are demanded, and further higher transmittance and higher contrast of a color filter are required.

From the manufacturing viewpoint of a color filter, higher sensitization of photosensitive compositions of a color filter, a broader development latitude, pigments having high dispersion stability which do not precipitate are demanded.

For attaining a high transmission factor of a color filter, there are methods of reducing the content of a pigment component in a photosensitive composition for a color filter or thinning a film thickness but the chroma of a color filter is reduced and a color filter becomes whitish as a whole due to these methods and color sharpness is lost.

Dianthraquinone-based pigments (e.g., PR-177, etc.) have so far been mainly used as a red pigment, as disclosed in JP-A-1-254918 and JP-A-2-153353. However, even these pigments cannot cope with the above-described demands in recent years, and a higher transmission factor cannot be obtained even by fine dispersion of these pigments.

As a novel method which does not require pigment dispersion, one method is disclosed in JP-A-8-6242, in which after an image is formed by molecularly dispersed pigment precursors, the pigment precursors are converted to pigments by a chemical process, a thermal process, or a photolysis process (a latent pigment). According to this method, since pigment conversion by a chemical process, a thermal process, or a photolysis process cannot be performed sufficiently, satisfactory results have not been obtained. In particular, as degrees of conversions of pigments differ according to temperature, pigments develop different colors according to heating temperature. Therefore, heat resistance is not sufficient and this method has not reached the stage of a practical use yet.

Any of the foregoing conventional techniques cannot sufficiently satisfy recent demands for a color filter.

SUMMARY OF THE INVENTION

Accordingly, the present invention has done for improving the above-described drawbacks of conventional techniques. An object of the present invention is to provide a photosensitive colored composition for a color filter which is high sensitive and the color filter obtained from which has a high transmission factor, high contrast, high resolving power, and constant and excellent chromaticity.

The above object of the present invention has been attained by the following constitution.

(1) A photosensitive colored composition for a color filter which comprises (A) a pigment, (B) a binding resin, (C) a radiation-sensitive compound, and (D) a solvent, wherein (A) a pigment contains a pigment having an average particle size of from 0.01 to 0.2 μm represented by formula (I):

(I)

wherein Y represents an oxygen atom or a sulfur atom; $R_1$ and $R_2$, which may be the same or different, each represents a hydrogen atom, an alkyl group, a cycloalkyl group, an alkenyl group, an alkynyl group, an aryl group, an aralkyl group, a carbamoyl group, an alkylcarbamoyl group, an arylcarbamoyl group, or an alkoxycarbonyl group; and $R_3$ and $R_4$, which may be the same or different, each represents an alkyl group, a cycloalkyl group, an aralkyl group, or a carbocyclic or heterocyclic aromatic residue.

Further, preferred embodiments are described below.

(2) The photosensitive colored composition for a color filter as described in the above item (1), wherein (A) a pigment contains a pigment having an average particle size of from 0.01 to 0.2 μm represented by formula (IA):

(IA)

wherein R represents a hydrogen atom, a methyl group, an ethyl group, a propyl group, —N(CH$_3$)$_2$, —N(C$_2$H$_5$)$_2$, —CF$_3$, a chlorine atom or a bromine atom.

DETAILED DESCRIPTION OF THE INVENTION

In the present invention, by using the above-described specific pigment in a photosensitive composition, as compared with conventionally used pigments (e.g., the above-described PR-177), a color filter of high sensitivity can be obtained as this pigment has a high transmission factor to ultraviolet rays and unnecessary light absorption by a pigment due to irradiation of ultraviolet rays does not occur at exposure, therefore, exposure efficiency is high. As a photosensitive colored composition for a color filter according to the present invention is high sensitive, exposure time is short and the producibility is improved. With respect to the producibility, in particular, the bigger the substrate, the more conspicuous is the effect. Further, developing properties are improved in the present invention. That is, image fluctuation (image roughness, line breadth fluctuation, etc.) due to developing conditions such as developing time, developing temperature, developing solution concentration is less (a development latitude is broad). In the photosensitive colored composition for a color filter according to the present invention, the profile of the edge part (the peripheral part) of an image tapers in right order (i.e., an image due tapers), i.e., the vertical section of the peripheral part of the image moderately slopes from the surface of the image toward the contact face with the substrate. By virtue of this structure, intimate contact with the substrate can be ensured.

As described above, as a pigment represented by formula (I) according to the present invention is high in ultraviolet transmittance, the concentration of a pigment in the composition can be increased, thereby a color filter having high color purity can be obtained. With pigments so far been used, when the concentration of a pigment is increased, an exposure part and a non-exposure part are difficult to be differentiated and a satisfactory pattern cannot be formed.

Further, in the photosensitive colored composition for a color filter according to the present invention, as a pigment is finely dispersed, light transmittance becomes high and light scattering due to coarse particles is less. Due to this factor, further high sensitivity can be obtained and the obtained color filter shows high resolving power and high contrast. In addition, as compared with the above-described latent pigment, a color filter having constant and excellent chromaticity can be obtained because a stable pigment is used.

The present invention is described in detail below.

(A) Pigment

In the present invention, a pigment having an average particle size of from 0.01 to 0.2 μm represented by formula (I) is contained.

In formula (I), the alkyl group represented by $R_1$, $R_2$, $R_3$ and $R_4$ may be branched or not branched, and preferably has from 1 to 18, more preferably from 1 to 12, and particularly preferably from 1 to 6, carbon atoms (e.g., methyl, ethyl, isopropyl, sec-butyl, tert-butyl, tert-amyl, octyl, decyl, dodecyl, octadecyl).

The cycloalkyl group represented by $R_1$, $R_2$, $R_3$ and $R_4$ preferably has from 3 to 8, and more preferably from 3 to 6, carbon atoms (e.g., cyclopentyl, cyclohexyl).

The alkenyl group represented by $R_1$ and $R_2$ preferably has from 2 to 8, and more preferably from 2 to 6, carbon atoms (e.g., vinyl, allyl).

The alkynyl group represented by $R_1$ and $R_2$ preferably has from 2 to 8, and more preferably from 2 to 6, carbon atoms (e.g., ethynyl).

The aryl group represented by $R_1$ and $R_2$ preferably has from 6 to 10 carbon atoms (e.g., phenyl, naphthyl).

As the alkyl group of the alkylcarbamoyl group represented by $R_1$ and $R_2$, the same alkyl groups as described above can be exemplified.

As the aryl group of the arylcarbamoyl group represented by $R_1$ and $R_2$, the same aryl groups as described above can be exemplified.

The alkoxyl group of the alkoxycarbonyl group represented by $R_1$ and $R_2$ preferably has from 1 to 4 carbon atoms (e.g., methoxy, ethoxy, butoxy).

When $R_1$, $R_2$, $R_3$ and $R_4$ each represents an aralkyl group in formula (I), a monocyclic to tricyclic group is preferred, and a monocyclic or bicyclic aryl residue is more preferred (e.g., benzyl, phenylethyl).

When $R_3$ and $R_4$ each represents a carbocyclic aromatic residue in formula (I), monocyclic to tetracyclic residues are preferred, and monocyclic or bicyclic residues are preferred among these (e.g., phenyl, diphenyl, naphthyl). Specific examples include the compound represented by the following formula:

wherein $T_1$, $T_2$ and $T_3$ are different in positions from each other and each represents hydrogen, halogen, carbamoyl, cyano, trifluoromethyl, alkylcarbamoyl having from 2 to 13 carbon atoms, alkyl having from 1 to 12 carbon atoms, alkoxyl having from 1 to 12 carbon atoms, alkylmercapto having from 1 to 12 carbon atoms, alkoxycarbonyl having from 2 to 13 carbon atoms, alkanoylamino having from 2 to 13 carbon atoms, monoalkylamino having from 1 to 12 carbon atoms, dialkylamino having from 2 to 24 carbon atoms, or phenoxy, phenylmercapto, phenoxycarbonyl, phenylcarbamoyl or benzoylamino each of which may be unsubstituted or substituted with halogen, alkyl having from 1 to 12 carbon atoms, or alkoxyl having from 1 to 12 carbon atoms;

The compound represented by the following formula:

wherein $T_4$ and $T_5$ are different in positions from each other and each represents hydrogen, chlorine, bromine, alkyl having from 1 to 4 carbon atoms, cyano, alkoxyl having from 1 to 4 carbon atoms, unsubstituted phenoxy or phenoxy substituted with chlorine or methyl, carbamoyl, alkylcarbamoyl having from 2 to 5 carbon atoms, unsubstituted phenylcarbamoyl or phenylcarbamoyl substituted with chlorine, methyl, or methoxy; or The compound represented by any of the following formulae:

wherein $T_6$ represents methyl, isobutyl, chlorine, bromine, methoxy, phenoxy, or cyano; $T_7$ represents methyl, chlorine, or cyano; and $T_7$ represents methyl or chlorine.

In formula (I), when $R_3$ and $R_4$ each represents a heterocyclic aromatic residue, monocyclic to tricyclic residues are preferred. They may be pure heterocyclic or may contain one heterocyclic ring and one or more condensed benzene ring (e.g., pyridyl, pyrimidyl, pyrazinyl, triazinyl, furanyl, pyrrolyl, thiophenyl, quinolyl, coumarynyl, benzofuranyl, benzimidazolyl, benzoxazolyl).

If $R_3$ and $R_4$ represent either a carbocyclic aromatic residue or a heterocyclic aromatic residue, they in some cases represent ordinary non-water-soluble substituents, e.g., those as disclosed in European Patent application (published) No. 94911.

In formula (I), $R_1$ and $R_2$ each preferably represents a hydrogen atom; and $R_3$ and $R_4$ each preferably represents an alkyl group having from 1 to 4 carbon atoms, a dialkylamino group, or a phenyl group which may have a haloalkyl group or a halogen atom as a substituent.

In the present invention, a pigment represented by formula (IA) is preferred. R more preferably represents a hydrogen atom, a chlorine atom, a bromine atom, or a methyl group, in particular, a chlorine atom.

A pigment represented by formula (I) can be synthesized according to the methods disclosed, for example, in U.S. Pat. No. 4,415,685, European Patent Publication 133156, and JP-A-61-120861.

A pigment represented by formula (I) can be used alone or can be used in combination with other pigments for adjusting chromaticity. Specific examples of other pigments are shown below. Pigments which can be used in combination are various kinds of yellow pigments and red pigments.

Examples of yellow pigments include C.I. Pigment Yellow 11, 24, 31, 53, 83, 93, 99, 109, 110, 117, 129, 138, 139, 150, 151, 167, and 185.

Examples of red pigments include C.I. Pigment Red 105, 122, 149, 150, 155, 171, 175, 177, 209, 224, and 255.

The use amount of the pigment which can be used in combination is preferably 200 weight parts or less, more preferably 100 weight parts or less, based on 100 weight parts of the pigment according to the present invention.

In the present invention, a pigment represented by formula (I) has an average particle size of from 0.01 to 0.2 $\mu$m, preferably from 0.01 to 0.15 $\mu$m, and more preferably from 0.01 to 0.1 $\mu$m.

The above-described pigments are synthesized and dried by various methods before being supplied. In general, they are dried from an aqueous medium and supplied as powder, but as a large evaporating latent heat is necessary for water to be dried, a large heat energy is required to dry pigments to make powder.

Therefore, pigments generally make up an agglomerate (secondary particles) comprising a gathering of primary particles.

It is not easy to disperse pigments which make up such an agglomerate to fine particles. Accordingly, it is preferred to previously treat pigments using various resins.

The later-described various resins can be used as these resins.

Examples of the treating methods include flashing treatment, and a kneading method using a kneader, an extruder, a ball mill, or a two- or three-roll mill. Of these, flashing treatment and a kneading method using a two- or three-roll mill is suitable for fine dispersion.

Flashing treatment is a method generally comprising mixing an aqueous dispersion solution of a pigment with a solution of a resin dissolved in a water-immiscible solvent, extracting the pigment into an organic medium from the aqueous medium, and treating the pigment with the resin. According to this method, the pigment can be prevented from being agglomerated and dispersed easily because the pigment is not subjected to drying.

A kneading method using a two- or three-roll mill is a method for treating a pigment which comprises mixing a pigment with a resin or a solution of a resin, then kneading the pigment and the resin with applying high shearing force and coating the resin on the surface of the pigment.

Moreover, processed pigments which have been previously processed with resins such as an acrylic resin, a vinyl chloride-vinyl acetate resin, a maleic resin, an ethyl cellulose resin or a nitrocellulose resin can also favorably be used in the present invention.

As the form of a processed pigment processed with a resin, powder, paste and a pellet comprising a resin and a pigment dispersed uniformly are preferred. An uneven lump-like processed pigment in which a resin has gelled is not preferred.

A composition according to the present invention can be prepared by mixing and dispersing the above-described component (A) a pigment and the later-described components (B), (C) and (D), and other additives as required using various kinds of mixers and dispersers.

Conventionally well-known mixers and dispersers can be used, e.g., a homogenizer, a kneader, a ball mill, a two- or three-roll mill, a paint shaker, a sand grinder, and a sand mill such as Dyno Mill.

As a preferred preparation method, there can be cited a method of adding a solvent to a pigment and a binding resin and mixing homogeneously in the first place, then kneading them by using a two- or three-roll mill with heating, if necessary, to thereby thoroughly mix the pigment and the binding resin to obtain a uniformly colored product.

Subsequently, a solvent is added to the obtained colored product, further, a dispersant and a variety of additives are added thereto according to necessity, and dispersion is carried out using a ball mill or various sand mills, e.g., Dyno-Mill in which glass beads are used as dispersion media. At this time, the smaller the diameter of glass beads, the finer is the obtained dispersed product. A dispersed product having good reproducibility can be obtained by controlling the temperature of a dispersion solution constant.

Coarse particles of the obtained dispersed product can be removed by centrifugation or decantation, if necessary.

Thus, the average particle size of the pigment particles in the obtained dispersion solution can be made to fall within the above-described range.

The thus-obtained colored dispersed product is mixed with components (B), (C) and (D) and supplied as a photosensitive colored composition.

Further, the concentration of the pigment in the entire solid contents of the photosensitive colored composition is preferably from 5% to 80% by weight. When the concentration is less than 5% by weight, color purity cannot be obtained if the film thickness is not 10 μm or more, which is practicably disadvantageous, while when it exceeds 80% by weight, a problem arises such that the contamination of a non-image part and film remaining are liable to occur. The concentration of the pigment is more preferably from 10% to 60% by weight.

(B) Binding resin

In the photosensitive colored composition according to the present invention, the following alkali-soluble resins and graft copolymers can be used as binding resins.

As such alkali-soluble binding resins, linear organic high polymers soluble in an organic solvent and developable in a weak alkali aqueous solution are preferred. As such linear organic high polymers, polymers having carboxylic acid at a side chain, e.g., methacrylic acid copolymers, acrylic acid copolymers, itaconic acid copolymers, crotonic acid copolymers, maleic acid copolymers, and partially esterified maleic acid copolymers, and also acid cellulose derivatives having carboxylic acid at a side chain disclosed in JP-A-59-44615, JP-B-54-34327 (the term "JP-B" as used herein means an "examined Japanese patent publication"), JP-B-58-12577, JP-B-54-25957, JP-A-59-53836 and JP-A-59-71048 can be exemplified. In addition to these, acid anhydride adducts of polymers having a hydroxyl group are also useful. Of these, benzyl (meth)acrylate/(meth)acrylic acid copolymers and terpolymers or more of benzyl (meth) acrylate/(meth)acrylic acid/other monomers are preferably used. Besides these, 2-hydroxyethyl methacrylate, polyvinyl pyrrolidone, polyethylene oxide, and polyvinyl alcohol are also useful. Further, nylon soluble in alcohol and polyether of 2,2-bis(4-hydroxyphenyl)propane and epichlorohydrin are also useful for strengthening a hardened film.

In addition to these, examples of binding resins for use in the present invention include 2-hydroxypropyl (meth)-acrylate/polystyrene macromonomer/benzyl methacrylate/methacrylic acid copolymers, 2-hydroxy-3-phenoxypropyl acrylate/polymethyl methacrylate macromonomer/benzyl methacrylate/methacrylic acid copolymers, 2-hydroxyethyl methacrylate/polystyrene macromonomer/methyl methacrylate/methacrylic acid copolymers, 2-hydroxyethyl methacrylate/polystyrene macromonomer/benzyl methacrylate/methacrylic acid copolymers disclosed in JP-A-7-140654.

Further, as those uniting a binding resin and a pigment dispersant, graft copolymers disclosed in JP-A-10-254133 as shown below can be used.

Copolymers at least comprising (1) a monofunctional macromonomer having a weight average molecular weight of $3 \times 10^4$ or less which comprises a polymeric double bond group represented by the following formula (A) at only one terminal of the main chain of the polymer having at least one polymer component at least represented by the following formula (IIa) or (IIb), (2) a monomer represented by the following formula (III), (3) a monomer of quaternary ammonium salt, and (4) a monomer having at least one substituted or unsubstituted amido group represented by the following formula (IV) in the molecule:

(A)

wherein $V_0$ represents —COO—, —OCO—, —CH$_2$OCO—, —CH$_2$COO—, —O—, —SO$_2$—, —CO—, —CONHCOO—, —CONHCONH—, —CONHSO$_2$—, —CON(P$_3$)—, —SO$_2$N(P$_3$)— or —C$_6$H$_4$— (P$_3$ represents a hydrogen atom or a hydrocarbon group); and $c_1$ and $c_2$, which may be the same or different, each represents a hydrogen atom, a halogen atom, a cyano group, a hydrocarbon group, —COO—Z', or —COO—Z' via a hydrocarbon group (Z' represents a hydrogen atom or a hydrocarbon group which may be substituted);

(IIa)

(IIb)

wherein $V_1$ has the same meaning as $V_0$ in formula (A); $Q_1$ represents an aliphatic group having from 1 to 18 carbon atoms or an aromatic group having from 6 to 12 carbon atoms; $d_1$ and $d_2$, which may be the same or different, each has the same meaning as $c_1$ and $c_2$ in formula (A); $Q_0$ represents —CN or —$C_6H_4$—T; T represents a hydrogen atom, a halogen atom, a hydrocarbon group, an alkoxyl group or —COOZ" (where Z" represents an alkyl group, an aralkyl group or an aryl group);

(III)

wherein $V_2$ has the same meaning as $V_1$ in formula (IIa); $Q_2$ has the same meaning as $Q_1$ in formula (IIa); and $e_1$ and $e_2$, which may be the same or different, each has the same meaning as $c_1$ and $c_2$ in formula (A);

(IV)

wherein $R_1$ and $R_2$, which may be the same or different, each represents a hydrogen atom, a hydrocarbon group having from 1 to 18 carbon atoms which may be substituted, or $R_1$ and $R_2$ may be bonded to each other to form a ring via an —O—, —S— or —$NR_3$— (where $R_3$ represents a hydrogen atom or a hydrocarbon group having from 1 to 12 carbon atoms).

Further, the following polymer disclosed in JP-A-10-20496 can also be used as a binding resin. The polymer is a polymer which can be obtained by the copolymerization reaction of a monomer represented by the following formula (K) and a monomer having at least an acidic group:

(K)

wherein R represents a hydrogen atom or a methyl group; $R_1$, $R_2$, $R_3$, $R_4$ and $R_5$ each represents a hydrogen atom, a halogen atom, a cyano group, an alkyl group, or an aryl group.

The above-described binding resins are preferably polymers having a weight average molecular weight of $1 \times 10^4$ or more, more preferably from $2 \times 10^4$ to $5 \times 10^5$.

The use amount of the above-described binding resins in the composition is preferably from 0.01 to 60% by weight, more preferably from 0.5 to 30% by weight, based on the entire solid contents in the composition.

(C) Radiation-Sensitive Compound

A radiation-sensitive compound according to the present invention comprises at least a polymerizable monomer and a photopolymerization initiator.

(1) A compound having at least one addition polymerizable-ethylenically unsaturated group having a boiling point of 100° C. or more under normal pressure.

(2) At least one active halogen compound selected from a halomethyl oxadiazole compound and a halomethyl-s-triazine compound, and a 3-aryl-substituted coumarin compound.

(3) At least one kind of lophine dimer.

As a compound having at least one addition polymerizable ethylenically unsaturated group and a boiling point of 100° C. or more under normal pressure, there can be exemplified a monofunctional acrylate and methacrylate such as polyethylene glycol mono(meth)acrylate, polypropylene glycol mono(meth)acrylate, and phenoxyethyl(meth) acrylate; compounds obtained by the addition of ethylene oxide or propylene oxide to polyfunctional alcohol such as polyethylene glycol di(meth)acrylate, trimethylolethane tri (meth)acrylate, neopentyl glycol di(meth)acrylate, pentaerythritol tri(meth)acrylate, pentaerythritol tetra(meth) acrylate, dipentaerythritol hexa(meth)acrylate, hexanediol (meth)acrylate, trimethylolpropane, tri(acryloyloxypropyl) ether, tri(acryloyloxyethyl)isocyanurate, glycerin, and trimethylolethane, and then having (meth)acrylated; urethane acrylates as disclosed in JP-B-48-41708, JP-B-50-6034, and JP-A-51-37193; polyester acrylates as disclosed in JP-A-48-64183, JP-B-49-43191, and JP-B-52-30490; and polyfunctional acrylates and methacrylates such as epoxy acrylates which are reaction products of epoxy resins and (meth)acrylic acids. Further, photocurable monomers and oligomers described in Nihon Setchaku Kyokai Shi (Bulletin of Japan Adhesion Association), Vol. 20, No. 7, pp. 300 to 308 can also be used.

Compounds represented by the following formula (B-1) or (B-2) can also be used.

wherein each B independently represents —($CH_2CH_2O$)— or —[$CH_2CH(CH_3)O$]—; each X independently represents an acryloyl group, a methacryloyl group or a hydrogen atom, and the total number of acryloyl groups and methacryloyl groups in formula (B-1) is 5 or 6 and that in formula (B-2) is 3 or 4; each n independently represents an integer of from 0 to 6 and the sum total of n is from 3 to 24; and each m independently represents an integer of from 0 to 6 and the sum total of m is from 2 to 16.

These radiation polymerizable monomers or oligomers are used in an arbitrary amount within the range not impairing the object and effect of the present invention so long as the composition according to the present invention can form a coating film having adhesive property by the irradiation of radiant rays. The use amount thereof is from 5 to 90% by weight, preferably from 10 to 50% by weight, based on the entire solid contents in the photosensitive colored composition.

As active halogen compounds such as halomethyl oxadiazole and halomethyl-s-triazine in the above item (2), a 2-halomethyl-5-vinyl-1,3,4-oxadiazole compound represented by the following formula I which is disclosed in JP-B-57-6096 can be exemplified:

I wherein W represents a substituted or unsubstituted aryl group; X represents a hydrogen atom, an alkyl group or an aryl group; Y represents a fluorine atom, a chlorine atom or a bromine atom; and n represents an integer of from 1 to 3.

Specific examples of the compounds represented by formula I include 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

As photopolymerization initiators of a halomethyl-s-triazine-based compound, a vinyl-halomethyl-s-triazine compound represented by the following formula II which is disclosed in JP-B-59-1281, a 2-(naphtho-1-yl)-4,6-bis-halomethyl-s-triazine compound represented by the following formula III which is disclosed in JP-A-53-133428, and a 4-(p-aminophenyl)-2,6-di-halomethyl-s-triazine compound represented by the following formula IV can be exemplified.

II wherein Q represents Br or Cl; P represents —CQ$_3$, —NH$_2$, —NHR, —N(R)$_2$, or —OR (where R represents a phenyl group or an alkyl group); W represents an arbitrarily substituted aromatic group, a heterocyclic nucleus, or a compound represented by the following formula IIA:

IIA wherein Z represents —O— or —S—.

III wherein X represents Br or Cl; m and n each represents an integer of from 0 to 3; R is represented by the following formula IIIA; R$_1$ represents H or OR (where R represents an alkyl group, a cycloalkyl group, an alkenyl group or an aryl group); and R$_2$ represents Cl, Br, an alkyl group, an alkenyl group, an aryl group or an alkoxyl group:

IIIA

IV

In formula IV, R$_1$ and R$_2$ each represents —H, an alkyl group, a substituted alkyl group, an aryl group, a substituted aryl group, or a compound represented by the following formula IVA or IVB; and R$_3$ and R$_4$ each represents —H, a halogen atom, an alkyl group, or an alkoxyl group:

IVA

IVB wherein R$_5$, R$_6$ and R$_7$ each represents an alkyl group, a substituted alkyl group, an aryl group, or a substituted aryl group. Examples of substituted alkyl groups and substituted aryl groups include an aryl group (e.g., phenyl), a halogen atom, an alkoxyl group, a carboalkoxyl group, a carboaryloxy group, an acyl group, a nitro group, a dialkylamino group, and a sulfonyl derivative. X represents —Cl or —Br, and m and n each represents 0, 1 or 2.

When R$_1$ and R$_2$ form, together with the nitrogen atom to which they are bonded, a heterocyclic ring comprising a nonmetal atom, the heterocyclic rings include the following:

Specific examples of the compounds represented by formula II include 2,4-bis(trichloromethyl)-6-p-methoxystyryl-s-triazine, 2,4-bis(trichloromethyl)-6-(1-p-dimethylaminophenyl-1,3-butadienyl)-s-triazine, and 2-trichloromethyl-4-amino-6-p-methoxystyryl-s-triazine.

Specific examples of the compounds represented by formula III include 2-(naphtho-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s- triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, and 2-(4,5-dimethoxy-naphtho-1-yl)-4,6-bis-trichloromethyl-s-triazine.

Specific examples of the compounds represented by formula IV include 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di-(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di-(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

These initiators can be used in combination with the following sensitizers.

Specific examples of these sensitizers include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzyl, dibenzalacetone, p-(dimethylamino)phenyl styryl ketone, p-(dimethylamino)phenyl-p-methyl styryl ketone, benzophenone, p-(dimethylamino)benzophenone (or Michler's ketone), p-(diethylamino)benzophenone, benzanthrone, and benzothiazole compounds disclosed in JP-B-51-48516.

A 3-aryl-substituted coumarin compound is represented by the following formula V:

V wherein $R_8$ represents a hydrogen atom, an alkyl group having from 1 to 8 carbon atoms, an aryl group having from 6 to 10 carbon atoms (preferably a hydrogen atom, a methyl group, an ethyl group, a propyl group, or a butyl group); and $R_9$ represents a hydrogen atom, an alkyl group having from 1 to 8 carbon atoms, an aryl group having from 6 to 10 carbon atoms, a group represented by the following formula VA (preferably a methyl group, an ethyl group, a propyl group, a butyl group, or a group represented by formula VA, particularly preferably a group represented by formula VA).

VA $R_{10}$ and $R_{11}$ each represents a hydrogen atom, an alkyl group having from 1 to 8 carbon atoms (e.g., methyl, ethyl, propyl, butyl, octyl), a haloalkyl group having from 1 to 8 carbon atoms (e.g., chloromethyl, fluoromethyl, trifluoromethyl), an alkoxyl group having from 1 to 8 carbon atoms (e.g., methoxy, ethoxy, butoxy), an aryl group having from 6 to 10 carbon atoms which may be substituted (e.g., phenyl), an amino group, —N($R_{16}$)($R_{17}$), or a halogen atom (e.g., —Cl, —Br, —F), preferably represents a hydrogen atom, a methyl group, an ethyl group, a methoxy group, a phenyl group, —N($R_{16}$)($R_{17}$), or —Cl.

$R_{12}$ represents an aryl group having from 6 to 16 carbon atoms which may be substituted (e.g., phenyl, naphthyl, tolyl, cumyl). Examples of substituents include an amino group, —N($R_{16}$)($R_{17}$), an alkyl group having from 1 to 8 carbon atoms (e.g., methyl, ethyl, propyl, butyl, octyl), a haloalkyl group having from 1 to 8 carbon atoms (e.g., chloromethyl, fluoromethyl, trifluoromethyl), an alkoxyl group having from 1 to 8 carbon atoms (e.g., methoxy, ethoxy, butoxy), a hydroxyl group, a cyano group, and a halogen atom (e.g., —Cl, —Br, —F).

$R_{13}$, $R_{14}$, $R_{16}$ and $R_{17}$ each represents a hydrogen atom or an alkyl group having from 1 to 8 carbon atoms (e.g., methyl, ethyl, propyl, butyl, octyl), $R_{13}$ and $R_{14}$, and $R_{16}$ and $R_{17}$ may be bonded to each other to form a heterocyclic ring together with a nitrogen atom (examples of the ring include, e.g., a piperidine ring, a piperazine ring, a morpholine ring, a pyrazole ring, a diazole ring, a triazole ring, a benzotriazole ring).

$R_{15}$ represents a hydrogen atom, an alkyl group having from 1 to 8 carbon atoms (e.g., methyl, ethyl, propyl, butyl, octyl), an alkoxyl group having from 1 to 8 carbon atoms (e.g., methoxy, ethoxy, butoxy), an aryl group having from 6 to 10 carbon atoms which may be substituted (e.g., phenyl), an amino group, —N($R_{16}$)($R_{17}$), or a halogen atom (e.g., —Cl, —Br, —F).

Zb represents =O, =S or =C ($R_{18}$) ($R_{19}$), preferably =O, =S or =C(CN)$_2$, and particularly preferably =O.

$R_{18}$ and $R_{19}$ each represents a cyano group, —COOR$_{20}$ or —COR$_{21}$; $R_{20}$ and $R_{21}$ each represents an alkyl group having from 1 to 8 carbon atoms (e.g., methyl, ethyl, propyl, butyl, octyl), a haloalkyl group having from 1 to 8 carbon atoms (e.g., chloromethyl, fluoromethyl, trifluoromethyl), or an aryl group having from 6 to 10 carbon atoms which may be substituted (e.g., phenyl).

Particularly preferred 3-aryl-substituted coumarin compounds are [(s-triazin-2-yl) amino]-3-aryl coumarin compounds represented by the following formula VI:

VI

A lophine dimer in the above item (3) means a 2,4,5-triphenylimidazolyl dimer comprising two lophine residues. The structural formula of the lophine dimer is shown below.

Specific examples of the lophine dimers include a 2-(o-chlorophenyl)-4,5-diphenylimidazolyl dimer, a 2-(o-fluorophenyl)-4,5-diphenylimidazolyl dimer, a 2-(o-methoxyphenyl)-4,5-diphenylimidazolyl dimer, a 2-(p-methoxyphenyl)-4,5-diphenylimidazolyl dimer, a 2-(p-dimethoxyphenyl)-4,5-diphenylimidazolyl dimer, a 2-(2,4-dimethoxyphenyl)-4,5-diphenylimidazolyl dimer, and a 2-(p-methylmercaptophenyl)-4,5-diphenylimidazolyl dimer.

Photopolymerization initiators represented by the following formulae (C) to (H) and (J) can also be used in the present invention.

(C)

(D)

(E)

(F)

(G)

(H)

In formulae (C) to (H), each $R_1$ independently represents a hydrogen atom, a hydroxyl group, an alkyl group having from 1 to 3 carbon atoms or an alkoxyl group having from 1 to 3 carbon atoms; $R_2$ and $R_3$ each independently represents a hydrogen atom or an alkoxyl group having from 1 to 3 carbon atoms, and either one of $R_2$ or $R_3$ represents an alkoxyl group; $R_4$ represents a hydrogen atom, an alkyl group having from 1 to 3 carbon atoms or an alkoxyl group having from 1 to 3 carbon atoms; $R_5$ and $R_6$ each independently represents an alkyl group having from 1 to 3 carbon atoms; $R_7$ represents a hydrogen atom, a hydroxyl group, an alkyl group having from 1 to 3 carbon atoms or an alkoxyl group having from 1 to 3 carbon atoms; and T is a group represented by the following formula:

wherein m represents an integer of from 1 to 3; and n represents an integer of from 1 to 4.

wherein n represents an integer of 1 or 2, when n is 1, $Ar_1$ represents a phenyl group or a phenyl group substituted with a chlorine atom, a bromine atom, a hydroxyl group, $-SR^9$, $-R^{10}$, $-OR^{10}$, $-SR^{10}$, $-SO_2R^{10}$, $-S$-phenyl, $-O$-phenyl or a morpholino group (wherein $R_{10}$ represents an alkyl group having from 1 to 9 carbon atoms), and when n is 2, $Ar_1$ represents a phenylene-T-phenylene group (wherein T represents $-O-$, $-S-$ or $-CH_2-$).

$R^9$ represents a hydrogen atom, an alkyl group having from 1 to 12 carbon atoms which may have a substituent, an alkenyl group having from 3 to 6 carbon atoms, a cyclohexyl group, a phenylalkyl group, a phenylhydroxyalkyl group, a phenyl group which may have a substituent, a tolyl group, $-CH_2-CH_2OH$, $-CH_2CH_2-OOC-CH=CH_2$, $-CH_2-COOR^{11}$ (wherein $R^{11}$ represents an alkyl group having from 1 to 9 carbon atoms), $-CH_2CH_2-COOR^{12}$ (wherein $R^{12}$ represents an alkyl group having from 1 to 4 carbon atoms), $R^1$ and $R^2$, which may be the same or different, each represents an alkyl group having from 1 to 8 carbon atoms which can be substituted with $-COOR^{12}$ ($R^{12}$ has the same meaning as described above), or a phenylalkyl group having from 7 to 9 carbon atoms, and $R^1$ and $R^2$ may join to represent an alkylene group having from 4 to 6 carbon atoms.

X represents a morpholino group, $-N(R^4)(R^5)$, $-OR^6$ or $-O-Si(R^7)(R^8)_2$.

$R^4$ and $R^5$, which may be the same or different, each represents an alkyl group having from 1 to 12 carbon atoms, an alkyl group having from 2 to 4 carbon atoms substituted with $-OR^{10}$, or an allyl group, and $R^4$ and $R^5$ may join to represent an alkylene group having 4 or 5 carbon atoms which may have $-O-$, $-NH-$ or $-N(R^{10})-$ between.

$R^6$ represents a hydrogen atom, an alkyl group having from 1 to 12 carbon atoms, an allyl group, or a phenylalkyl group having from 7 to 9 carbon atoms.

$R^7$ and $R^8$, which may be the same or different, each represents an alkyl group having from 1 to 4 carbon atoms, or a phenyl group.

Well-known polymerization initiators other than those described above can be used in the present invention.

Examples of such polymerization initiators include a vicinal polyketol aldonil compound disclosed in U.S. Pat. No. 2,367,660; an α-carbonyl compound disclosed in U.S. Pat. Nos. 2,367,661 and 2,367,670; acyloin ether disclosed in U.S. Pat. No. 2,448,828; an α-hydrocarbon-substituted aromatic acyloin compound disclosed in U.S. Pat. No. 2,722,512; a polynuclear quinone compound disclosed in U.S. Pat. Nos. 3,046,127 and 2,951,758, a combination of triallylimidazole dimer/p-aminophenyl ketone disclosed in U.S. Pat. No. 3,549,367; and a combination of benzothiazole-based compound/trihalomethyl-s-triazine compound disclosed in JP-B-51-48516.

The use amount of an initiator is from 0.01 to 50% by weight, preferably from 1 to 20% by weight, based on the solid content of monomers (or oligomers). If the amount of an initiator is less than 0.01% by weight, polymerization is reluctant to progress, and if it exceeds 50% by weight, the molecular weight becomes low and film strength becomes weak, although polymerization rate becomes high.

Various additives can be added to the composition according to the present invention, if necessary, e.g., a filler, high polymers other than those described above, a surfactant, an adhesion accelerator, an antioxidant, an ultraviolet absorber, and an agglomeration preventive.

Specific examples of these additives include a filler such as glass and alumina; a high polymer compound other than a binder polymer represented by formula (A) such as polyvinyl alcohol, polyacrylic acid, polyethylene glycol monoalkyl ether, and polyfluoroalkyl acrylate; nonionic, cationic and anionic surfactants; an adhesion accelerator such as vinyl trimethoxysilane, vinyl triethoxysilane, vinyl tris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; an antioxidant such as 2,2-thiobis(4-methyl-6-t-butylphenol), and 2,6-di-t-butylphenol, an ultraviolet absorber such as 2-(3-t-butyl-5-methyl-2-hydroxyphenyl)-5-chlorobenzotriazole, and alkoxybenzophenone; and an agglomeration-preventing agent such as sodium polyacrylate.

Further, when alkali solubility of the part not irradiated with radiation is accelerated and the developing property of the composition according to the present invention is further improved, an organic carboxylic acid, preferably a low molecular weight organic carboxylic acid having a molecular weight of 1,000 or less, can be added to the composition according to the present invention. Specific examples of such organic carboxylic acids include aliphatic monocarboxylic acid, e.g., formic acid, acetic acid, propionic acid, butyric acid, valeric acid, pivalic acid, caproic acid, diethylacetic acid, enanthic acid, and caprylic acid; aliphatic dicarboxylic acid, e.g., oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acid, e.g., tricarballylic acid, aconitic acid, and camphoronic acid; aromatic monocarboxylic acid, e.g., benzoic acid, toluic acid, cuminic acid, hemellitic acid, and mesitylenic acid; aromatic polycarboxylic acid, e.g., phthalic acid, isophthalic acid, terephthalic acid, trimellitic acid, trimesic acid, mellophanic acid, and pyromellitic acid; and other carboxylic acid, e.g., phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid, and umbellic acid.

As is not necessarily required in the present invention, a dispersant can be added for improving the dispersibility of a pigment. Various dispersants can be used as such a dispersant, e.g., phthalocyanine derivatives (EFKA-745, commercially available from EFKA Co., Ltd.); cationic surfactants, e.g., organosiloxane polymer, KP341 (manufactured by Shin-Etsu Chemical Industry Co., Ltd.), (meth)acrylic acid polymer, Polyflow No. 75, No. 90, No. 95 (manufactured by Kyoei-Sha Yushi Kagaku Kogyo Co., Ltd.), and W001 (manufactured by Yusho); nonionic surfactants, e.g., polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan aliphatic acid ester; fluorine surfactants, e.g., Eftop EF301, EF303, EF352 (manufactured by Shin Akita Kasei Co., Ltd.), Megafac F171, F172, F173 (manufactured by Dainippon Chemicals and Ink Co., Ltd.), Florard FC430, FC431 (manufactured by Sumitomo 3M Co., Ltd.), and Asahi Gard G710, Serflon S382, SC-101, SC-102, SC-103, SC-104, SC-105, SC-1068 (manufactured by Asahi Glass Co., Ltd.); anionic surfactants, e.g., W004, W005, W017 (manufactured by Yusho Co., Ltd.); high polymer dispersants, e.g., EFKA-46, EFKA-47, EFKA-47EA, EFKA Polymer 100, EFKA Polymer 400, EFKA Polymer 401, EFKA Polymer 450 (manufactured by EFKA Co., Ltd.), Disperse Aid 6, Disperse Aid 8, Disperse Aid 15, Disperse Aid 9100 (manufactured by San Nopco Co., Ltd.); various kinds of Solspers dispersants, e.g., Solspers 3000, 5000, 9000, 12000, 13240, 13940, 17000, 20000, 24000, 26000, and 28000 (manufactured by Zeneca Co., Ltd.); and Isonet S-20 (manufactured by Sanyo Chemical Industries Co., Ltd.).

These dispersants may be used alone or in combination of two or more. They are used in a pigment solution in an amount of generally from 0.1 to 50 weight parts based on 100 weight parts of the pigment.

In addition to the above, it is further preferred that a thermal polymerization inhibitor is added to the radiation-sensitive composition according to the present invention. Examples of the thermal polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), 2-mercaptobenzimidazole, etc.

The following-described solvents are preferably used for preparing the composition according to the present invention: esters, e.g., ethyl acetate, n-butyl acetate, isobutyl acetate, amyl formate, isoamyl acetate, isobutyl acetate, butyl propionate, isopropyl butyrate, ethyl butyrate, and butyl butyrate; alkyl esters, e.g., methyl lactate, ethyl lactate, methyloxy acetate, ethyloxy acetate, butyloxy acetate, methylmethoxy acetate, ethylmethoxy acetate, butylmethoxy acetate, methylethoxy acetate, and ethylethoxy acetate; 3-oxypropionic acid alkyl esters, e.g., methyl 3-oxypropionate, and ethyl 3-oxypropionate; methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, and ethyl 2-oxobutanoate; ethers, e.g., diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate, and propylene glycol propyl ether acetate; ketones, e.g., methyl ethyl ketone, cyclohexanone, 2-heptanone, and 3-heptanone; and aromatic hydrocarbons, e.g., toluene and xylene.

Of these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, and propylene glycol methyl ether acetate are preferably used.

The composition of the present invention is coated on a substrate by a coating method such as rotary coating, flow coating or roll coating to form a radiation-sensitive composition layer, the coated layer is exposed through a prescribed mask pattern, developed using a developing solution, thus the colored pattern is formed. As radiation at this time, the ultraviolet rays such as g-ray and i-ray are particularly preferably used.

As a substrate, e.g., soda glass, pyrex (glass), quartz glass which are used for liquid crystal display elements, those comprising soda glass, pyrex (glass), or quartz glass to which a transparent conductive film is adhered, and a substrate of photoelectric conversion element for use as a solid state camera element, e.g., silicon substrate, can be exemplified. Black stripes are generally formed on these substrates to isolate each pixel.

Any developing solution can be used so long as it solves radiation-sensitive colored composition according to the present invention but does not solve the part where radiation is irradiated. Specifically, various combinations of organic solvents or an alkaline aqueous solution can be used.

As such organic solvents, the above-described organic solvents which are used when the composition according to the present invention is prepared can be used.

As alkalis, an alkaline aqueous solution comprising an alkali compound, e.g., sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, or 1,8-azabicyclo[5,4,0]-7-undecene, which is dissolved so as to reach the concentration of from 0.001 to 10% by weight, preferably from 0.01 to 1% by weight, is used. Further, when a developing solution comprising such an alkaline aqueous solution is used, the color filter is, in general, washed with water after development.

EXAMPLE

The present invention is described in detail below with referring to examples but the present invention is not limited thereto without departing the scope of the invention.

EXAMPLE 1

The following composition was kneaded using a two-roll mill.

| | |
|---|---|
| Red pigment (pigment of the invention*) | 100 parts |
| Benzyl methacrylate/methacrylic acid (70/30 molor ratio) (weight average molecular weight: 30,000) | 100 parts |
| Cyclohexanone | 140 parts |
| Propylene glycol monomethyl ether acetate | 160 parts |

(* As the pigment according to the present invention, the compound represented by formula (IA) described above in which every R represents a chlorine atom was used. Hereinafter this is referred to as IA-1.)

After the kneaded product was pulverized, propylene glycol monomethyl ether acetate was added to obtain the pigment concentration of 15% by weight, and then Disper Aid 163 (a pigment dispersant produced by of BYK-Chimie Japan K.K.) was added as a pigment dispersant in an amount of 20 wt % based on the pigment and the solution was dispersed using a beads mill (Dyno-Mill, a disperser produced by Shinmaru Enterprises). The particle size measured by a centrifugal transmission type particle size measuring apparatus CAPA-700 (a product of Horiba Seisakusho Co., Ltd.) was 0.07 μm on average.

The following composition was prepared using the obtained dispersed product and coated on a glass substrate for a color filter in a coating thickness of 1.2 μm. The coated sample was irradiated through a mask with an extra-high pressure mercury lamp of 2.5 kW in an exposure amount of 100 mj/cm$^2$, developed with a 0.25% aqueous solution of sodium carbonate at 25° C. for 40 seconds, and post-baked at 230° C. for 30 minutes. Chromaticity was measured using a chromoscope MCPD-1000 (a product of Ohtsuka Denshi Co., Ltd.).

| The above dispersion solution (the concentration of pigment: 14% by weight) | 300 parts |
| Pentaerythritol tetraacrylate | 30 parts |
| 4-[o-Bromo-p-N,N-di(ethoxycarbonyl)-aminophenyl]-2,6-di(trichloromethyl)-s-triazine | 0.5 parts |
| Irgacure 907 (manufactured by Chiba Specialty Chemicals Co., Ltd.) | 0.5 parts |
| Hydroquinone monomethyl ether | 0.01 parts |
| Propylene glycol monomethyl ether acetate | 100 parts |

Chromaticity, development latitude, image roughness, edge profile, and particle size were evaluated as follows.

Methods and Criteria of Evaluation

Chromaticity: Measured using a chromoscope MCPD-1000 (a product of Ohtsuka Denshi Co., Ltd.)

Indicated by Yxy value of XYZ system of color representation of CIE (Commission Internationale de l'Eclairage) The larger the Y value, the larger is the brightness of the color (brighter).

Development latitude: Fluctuation of line breadth of 25 μm was measured, and if the developing time breadth giving line breadth fluctuation ±10% was:
  40 Seconds or more: ○
  30 Seconds or more and less than 40 seconds Δ:
  Less than 30 seconds: ×
Image roughness: The surface roughness of the image part was observed and evaluated by SEM (scanning electron microscope) at developing time of reproducing negative/positive line breadths in 1/1.
  ○: No surface roughness was observed.
  ×: Surface roughness was apparently observed.
  Δ: Surface roughness was observed a little.
Edge profile: The cross section of line breadth of 25 μm was observed by SEM.
  ○: Due taper
  ×: Reverse taper
  Δ: Vertical
Particle size: Average particle size measured by a centrifugal transmission type particle size measuring apparatus CAPA-700 (a product of Horiba Seisakusho Co., Ltd.).

COMPARATIVE EXAMPLE 1

A photosensitive composition was prepared in the same manner as in Example 1 except for replacing IA-1 with PR-177 (shown below) and evaluation was conducted.

PR-177

EXAMPLES 2 TO 6

Photosensitive compositions were prepared in the same manner as in Example 1 except for using IA-1 in combination with PR-177 differently dispersed or with various Y pigments (PY-139, PY-150, PY-185) as shown in Table 1, and evaluation was conducted in the same manner as in Example 1.

COMPARATIVE EXAMPLE 2

A photosensitive composition was prepared in the same manner as in Example 1 except for dispersing IA-1 so as to reach the average particle size of 0.30 μm, and evaluation was conducted in the same manner as in Example 1.

The results of evaluation in the above examples and comparative examples are shown in Table 2 below.

TABLE 1

| Example No. | Pigment-1 | Pigment-2 | Pigment-3 |
| --- | --- | --- | --- |
| Example 1 | IA-1: 100 parts | | |
| Comparative Example 1 | PR-177: 100 parts | | |
| Comparative Example 2 | IA-1: 100 parts | | |
| Example 2 | IA-1: 90 parts | PY-139: 10 parts | |
| Example 3 | IA-1: 90 parts | PY-150: 10 parts | |
| Example 4 | IA-1: 90 parts | PY-185: 10 parts | |
| Example 5 | IA-1: 50 parts | | PR-177: 50 parts |
| Example 6 | IA-1: 40 parts | PY-139: 30 parts | PR-177: 30 parts |

TABLE 2

| Example No. | Chromaticity Y | Chromaticity x | Chromaticity Y | Development Latitude | Image Roughness | Edge Profile | Particle Size (μm) |
|---|---|---|---|---|---|---|---|
| Example 1 | 26.4 | 0.560 | 0.311 | ◯ | ◯ | ◯ | 0.07 |
| Comparative Example 1 | 17.3 | 0.560 | 0.295 | x | x | x | 0.10 |
| Comparative Example 2 | 23.8 | 0.558 | 0.310 | x | x | x | 0.30 |
| Example 2 | 24.9 | 0.580 | 0.320 | ○ | ○ | ○ | 0.11 |
| Example 3 | 25.0 | 0.584 | 0.323 | ○ | ○ | ○ | 0.13 |
| Example 4 | 25.2 | 0.583 | 0.325 | ○ | ○ | ○ | 0.11 |
| Example 5 | 19.0 | 0.605 | 0.308 | Δ | ○ | Δ | 0.09 |
| Example 6 | 22.4 | 0.559 | 0.311 | Δ | ○ | Δ | 0.10 |

Each sample in Examples 1 to 6 showed excellent properties such that brightness by the measurement values of chromaticity was high, development latitude was broad, image roughness was little, and edge profile was due taper.

On the other hand, it was found as compared with the sample in Example 1 that the sample in Comparative Example 1 was narrow in development latitude, image roughness was large and edge profile was from vertical to reverse taper. As for the sample in Comparative Example 2, chromaticity was satisfactory but development latitude, image roughness and edge profile were far from satisfactory.

COMPARATIVE EXAMPLE 3

As an example of a latent pigment, the sample of a film prepared by the method disclosed in Example 1 in JP-A-8-6264 was heated at 200° C. for 30 seconds to be colored. When the sample was subsequently heated at 240° C. for 30 minutes, the chromaticity was apparently varied. This variation in chromaticity was $\Delta S_{Ab}=10.5$. On the other hand, when the colored film in Example 1 of the present invention was similarly heated at 240° C. for 30 minutes, the chromaticity was hardly varied and $\Delta E_{UV}$ was 1.4. Herein, $\Delta E_{UV}$ means color difference in L*U*V* color specification system.

Figure 1:
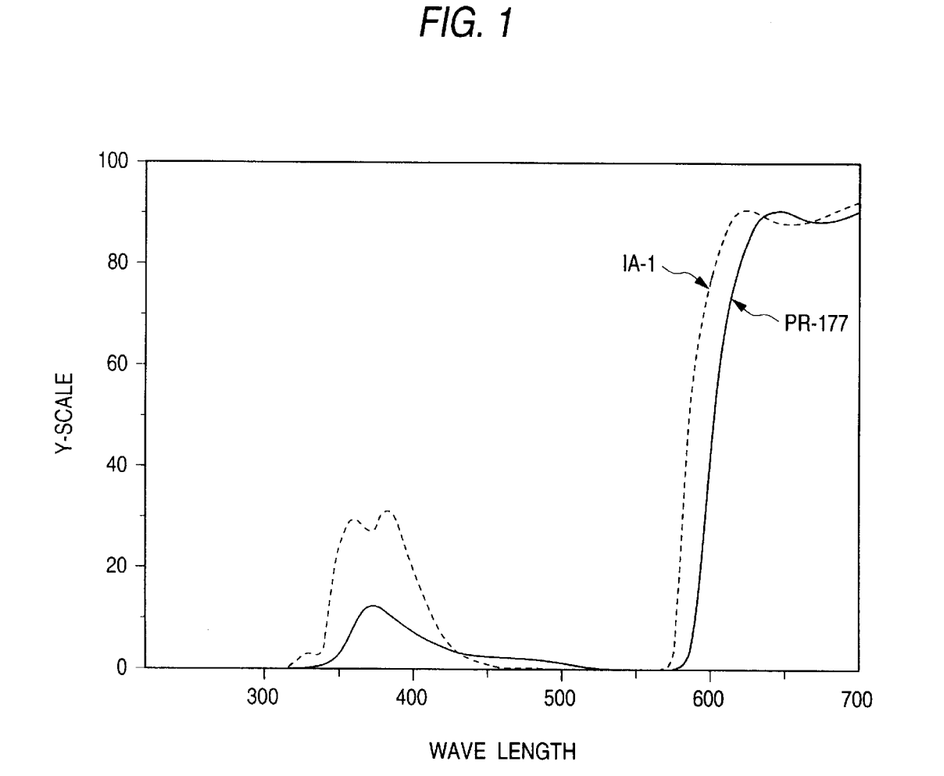
FIG. 1 shows transmission spectra of Pigment IA-1 according to the present invention and PR-177 conventionally used.

Transmission spectra of pigment IA-1 according to the present invention and PR-177 so far been used were compared. IA-1 showed high transmittance at main transmission region of from 600 to 610 nm and also transmittance in the vicinity of from 350 to 430 nm was also high. As unnecessary ultraviolet absorption is less, exposure necessary for polymerization can be effectively performed.

EFFECT OF THE INVENTION

The photosensitive colored composition for a color filter according to the present invention is high sensitive and the color filter obtained by using the photosensitive colored composition according to the present invention exhibits high transmittance, high contrast, high resolving power and constant and excellent chromaticity.

While the invention has been described in detail and with reference to specific examples thereof, it will be apparent to one skilled in the art that various changes and modifications can be made therein without departing from the spirit and scope thereof.

What is claimed is:

1. A photosensitive colored composition for a color filter adapted for use with a liquid crystal display element and a solid state camera element which comprises (A) a pigment, (B) a binding resin, (C) a radiation-sensitive compound, and (D) a solvent, wherein (A) a pigment contains a pigment having an average particle size of from 0.01 to 0.2 μm represented by formula (I):

wherein Y represents an oxygen atom or a sulfur atom; $R_1$ and $R_2$, which may be the same or different, each represents a hydrogen atom, an alkyl group, a cycloalkyl group, an alkenyl group, an alkynyl group, an aryl group, an aralkyl group, a carbamoyl group, an alkylcarbamoyl group, an arylcarbamoyl group, or an alkoxycarbonyl group; and $R_3$ and $R_4$, which may be the same or different, each represents an alkyl group, a cycloalkyl group, an aralkyl group, or a carbocyclic or heterocyclic aromatic residue.

2. The photosensitive colored composition for a color filter as claimed in claim 1, wherein (A) a pigment contains a pigment having an average particle size of from 0.01 to 0.2 μm represented by formula (IA):

wherein R represents a hydrogen atom, a methyl group, an ethyl group, a propyl group, $-N(CH_3)_2$, $-N(C_2H_5)_2$, $-CF_3$, a chlorine atom or a bromine atom.

3. The photosensitive colored composition for a color filter as claimed in claim 1, wherein said pigment has an average particle size of 0.01 to 0.15 μm.

4. The photosensitive colored composition for a color filter as claimed in claim 1, wherein said pigment is used in a concentration of form 5 to 80% by weight based on the entire solid contents of said composition.

5. The photosensitive colored composition for a color filter as claimed in claim 1, wherein said binding resin has a weight average molecular weight of $1 \times 10^4$ or more.

6. The photosensitive colored composition for a color filter as claimed in claim 1, wherein said binding resin is used in an amount of from 0.01 to 60% by weight based on the entire solid contents in said composition.

7. The photosensitive colored composition for a color filter as claimed in claim 1, wherein said radiation-sensitive compound comprises a radiation polymerizable monomer or oligomer and a photopolymerization initiator.

8. The photosensitive colored composition for a color filter as claimed in claim 7, wherein said radiation polymerizable monomer or oligomer is used in an amount of from 5 to 90% by weight based on the entire solid content in said composition.

9. The photosensitive colored composition for a color filter as claimed in claim 7, wherein said photopolymerization initiator is used in an amount of from 0.01 to 50% by weight based on the solid contents of the radiation polymerizable monomer or oligomer.

* * * * *

UNITED STATES PATENT AND TRADEMARK OFFICE
CERTIFICATE OF CORRECTION

PATENT NO. : 6,140,016
DATED : Oct. 31, 2000
INVENTOR(S) : Nobuo Suzuki, et al It is certified that error appears in the above-identified patent and that said Letters Patent is hereby corrected as shown below:

In item [73] of the face page of the patent, under "Assignees:", change "Fujifilm Olin Co., Ltd., Shizuoka" to -- Fujifilm Olin Co., Ltd., Tokyo --.

Signed and Sealed this

Eighth Day of May, 2001

Attest:

NICHOLAS P. GODICI

Attesting Officer

Acting Director of the United States Patent and Trademark Office